(12) United States Patent
Horstmann et al.

(10) Patent No.: US 6,555,892 B2
(45) Date of Patent: Apr. 29, 2003

(54) SEMICONDUCTOR DEVICE WITH REDUCED LINE-TO-LINE CAPACITANCE AND CROSS TALK NOISE

(75) Inventors: Manfred Horstmann, Dresden (DE); Karsten Wieczorek, Reichenberg-Boxdorf (DE); Frederick N. Hause, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 108 days.

(21) Appl. No.: 09/812,372

(22) Filed: Mar. 20, 2001

(65) Prior Publication Data

US 2002/0056887 A1 May 16, 2002

(30) Foreign Application Priority Data

Nov. 16, 2000 (DE) .......................... 100 56 868

(51) Int. Cl.$^7$ .................... H01L 29/00; H01L 21/336
(52) U.S. Cl. .................... 257/508; 257/501; 438/303
(58) Field of Search .................... 257/59, 330, 368, 257/501, 508, 522; 438/158, 199

(56) References Cited

U.S. PATENT DOCUMENTS

| | | | | |
|---|---|---|---|---|
| 5,472,890 A | | 12/1995 | Oda .......................... 437/41 |
| 5,859,466 A | * | 1/1999 | Wada .......................... 257/508 |
| 5,882,983 A | | 3/1999 | Gardner et al. .............. 438/424 |
| 6,057,583 A | * | 5/2000 | Gardner et al. .............. 257/330 |
| 6,087,705 A | * | 7/2000 | Gardner et al. .............. 257/501 |
| 6,107,667 A | | 8/2000 | An et al. ..................... 257/408 |
| 6,114,715 A | * | 9/2000 | Hamada ....................... 257/59 |
| 6,124,177 A | | 9/2000 | Lin et al. .................... 438/308 |
| 6,137,126 A | | 10/2000 | Avanzino et al. ........... 257/288 |
| 6,153,445 A | * | 11/2000 | Yamazaki et al. ........... 438/158 |
| 6,190,996 B1 | * | 2/2001 | Mouli et al. ................. 257/522 |
| 6,274,919 B1 | * | 8/2001 | Wada .......................... 257/508 |
| 6,303,418 B1 | * | 10/2001 | Cha et al. .................... 438/199 |
| 6,351,013 B1 | * | 2/2002 | Luning et al. ............... 257/368 |

* cited by examiner

Primary Examiner—John F. Niebling
Assistant Examiner—Walter Lindsay, Jr.
(74) Attorney, Agent, or Firm—Williams, Morgan & Amerson, P.C.

(57) ABSTRACT

A transistor device is disclosed, having an insulating material disposed between the gate electrode and the drain and source lines, wherein the dielectric constant of the insulating material is 3.5 or less. Accordingly, the capacitance between the gate electrode and the drain and source lines can be reduced, thereby improving signal performance of the field effect transistor with decreased cross talk noise.

9 Claims, 2 Drawing Sheets

SEMICONDUCTOR DEVICE WITH REDUCED LINE-TO-LINE CAPACITANCE AND CROSS TALK NOISE

BACKGROUND OF THE INVENTION

1. Field of the Invention

The present invention relates to VLSI semiconductor devices and, particularly, relates to the problem of line-to-line capacitance and cross talk noise in semiconductor devices in ultra-high density circuits.

2. Description of the Related Art

The manufacturing process of integrated circuits (ICs) involves the fabrication of numerous semiconductor devices, such as insulated gate field effect transistors on a single substrate. In order to have increased integration density and improved device performance, for instance, with respect to signal processing time and power consumption, feature sizes of the semiconductor devices are steadily decreasing. Decreasing feature sizes provide a variety of advantages, such as high package density and small rise and fall times during switching of the transistors due to reduced channel length. However, these advantages may be offset by certain disadvantages such as increased resistances of interconnects and higher coupling capacitances between adjacent lines when feature sizes are further decreased. Moreover, the increased resistance and/or the increase in capacitive coupling also slow the speed at which electrical signals propagate along the interconnects. This may be generally referred to as interconnect delay.

Generally, interconnect delay begins to dominate overall device delay in devices with feature sizes, e.g., gate lengths, on the order of 0.18 µm, so that device features of 0.18 µm and smaller will result in a deteriorated device performance, thereby restricting, for example, the clock frequency of CPUs. In modern ultra-high density circuits, not only interconnect delay is an important issue, but also formation of local interconnects, i.e., connections which provide for contact to the drain and source regions of a field effect transistor. The design rules in modern integrated circuits, for example, in ultra-high density CMOS circuits, require small distances between the gate electrode and the local interconnects in the range of 10–250 nm. These distances are even smaller when slight misalignments occur in the formation of the openings for the respective local interconnects.

For the sake of clarity, a typical prior art process flow will be described with reference to FIGS. 1a and 1b in order to detail some of the problems involved with the formation of local interconnects in modern integrated circuits. As the skilled person will easily appreciate, the figures depicting the prior art processing are merely of schematic nature, and transition and boundaries illustrated as sharp lines may not be imparted as sharp transitions in a real device. Furthermore, the description of the typical prior art process flow refers to standard manufacturing procedures without specifying typical parameter values used for these procedures, since the individual processing steps may be accordingly adapted to meet specific design requirements.

FIG. 1a shows a schematic cross-sectional view of a field effect transistor device at a specific manufacturing stage. In a semiconductor substrate 1, shallow trans-isolations 2 define a transistor region. A gate electrode 4 is formed over a substrate 1 and isolated therefrom by a gate insulation layer 3. Adjacent to the gate insulation layer 3, lightly doped regions 5 are formed. As the skilled person will readily appreciate, the gate electrode 4 may be formed by DUV (deep ultraviolet) mask technology and, thereafter, the lightly doped regions 5 are formed by ion implantation.

FIG. 1b schematically shows a cross-sectional view of the field effect transistor in a more advanced manufacturing stage. Adjacent to the sidewalls of the gate electrode 4, sidewall spacers 7 are formed and extend along a width dimension of the transistor, which is defined as the direction perpendicular to the drawing plane of FIG 1b. The lateral dimension of the gate electrode 4, on the other hand, is generally referred to as the length dimension. For example, the width of the gate electrode 4, i.e., the distance between the sidewall spacers 7 depicted in FIG. 1b, is generally referred to as the gate length of the transistor. Furthermore, drain and source regions 6 are formed. Formation of the sidewall spacers 7 may be performed by deposition of a silicon dioxide or a silicon nitride or a silicon oxynitride layer and subsequent anisotropic etch. The dielectric constant "k" of these materials typically ranges from 3.9–6, depending on the type of deposition process used. After formation of the sidewall spacers 7, the highly doped source and drain regions 6 are formed by means of ion implantation and rapid thermal annealing as is well known to the skilled person.

FIG. 1c shows a schematic cross-sectional view of the transistor device in a further advanced manufacturing stage. An interlayer of dielectric material 8 is formed over the structure and comprises openings 9 which at least partially expose the surface of the drain and source region, respectively. A typical process flow for forming the openings 9 and the interlayer 8, generally referred to as Local Intercontact (LI) process sequence, typically includes the following steps. First, the interlayer of dielectric material (ILD) 8 is deposited by chemical vapor deposition (CVD) from TEOS. Next, the surface of the ILD 8 is planarized by performing a chemical mechanical polishing (CMP) process. Thereafter, the openings 9, in form of vias or lines, are formed by using standard masking and etch techniques. As can be seen in FIG. 1c, in general, minor misalignments occur during the formation of the openings 9, so that, usually, the distances of the openings 9 to the gate electrode 4 are not exactly identical.

FIG. 1d schematically shows the transistor device of FIG. 1c with the openings 9 filled with a metal, such as tungsten, so as to provide electrical contact to the drain and source regions 6. Moreover, a further CMP process has been performed to level the surface of the ILD 8 and the metal in the openings 9. As the skilled person will appreciate, a thin barrier layer (not shown) may be deposited prior to filling the openings 9 with the metal.

The distances between the gate electrode 4 and the metal in the openings 9 is in the range of 10–250 nm in modern ultra-high density semiconductor circuits. This distance may even be smaller depending on the magnitude of any misalignment occurring during the formation of the openings 9. The parasitic capacitance formed between the metal and the gate electrode is inversely proportional to the distance between the metal and the gate electrode and, thus, the time constant for switching the transistor device increases as the distance between the metal and the gate electrode decreases. Moreover, cross talk noise between the drain and source regions and the gate electrode also increases with a decreasing distance. As a consequence, in ultra-high density semiconductor circuits, the advantages gained by steadily decreasing the transistor length, i.e., the gate length, are, at least partially, nullified by the decreasing distance between source and drain lines and the gate electrode, thereby resulting in an increased parasitic capacitance and cross talk noise therebetween.

In view of the above, there exists a need for an improved field effect transistor device having a lower capacitance between its drain and source region and the gate electrode so as to improve device performance of ultra-high density semiconductor circuits.

SUMMARY OF THE INVENTION

According to one aspect of the present invention, there is provided a field effect transistor device in an integrated circuit manufactured on a substrate, comprising a gate electrode having opposing sidewalls extending along a width direction of the transistor, the gate electrode being formed over a substrate and separated therefrom by a gate insulation layer, a drain line at least partially formed over a drain region, the drain line electrically connecting to the drain region, and a source line at least partially formed over a source region, the source line electrically connecting to the source region, the drain line and the source line being electrically insulated and spaced apart from the gate electrode by a sidewall spacer comprised of a material having a dielectric constant that is 3.5 or less.

According to another aspect of the present invention, there is provided a field effect transistor device in an integrated circuit manufactured on a substrate, comprising a gate electrode having opposing sidewalls extending along a width direction of the transistor, the gate electrode being formed over a substrate and separated therefrom by a gate insulation layer, a drain line at least partially formed over a drain region, the drain line electrically connecting to the drain region, a source line at least partially formed over a source region, the source line electrically connecting to the source region, the drain line and the source line being electrically insulated and spaced apart from the gate electrode by a sidewall spacer, wherein a ratio of a distance between the drain line and the gate electrode and the dielectric constant of the sidewall spacer, and a ratio of a distance between the source line and the gate electrode and the dielectric constant of the sidewall spacer are equal or less than 0.35 $nm^{-1}$.

According to still another aspect of the present invention, there is provided a method of manufacturing a field effect transistor, comprising the steps of providing a substrate having a surface, forming an active region in the substrate, forming a gate electrode over the substrate, the gate electrode being electrically insulated from the substrate by a gate insulation layer, forming dielectric sidewall spacers adjacent the gate electrode and extending along the gate electrode in a width direction of the transistor, the sidewall spacers being comprised of a material having a dielectric constant that is 3.5 or less, forming a drain and a source region in the active region adjacent the gate electrode, depositing an insulating layer over the substrate, forming openings at least partially over the drain and source region, respectively, filling the openings with an electrically conductive material so as to form a drain line and a source line, wherein the sidewall spacers assist in electrically isolating and spatially separating the gate electrode from the drain line and the source line.

Since the capacitance between the drain region or the source region and the gate electrode is dependent on the dielectric constant "k" of the sidewall spacer material and is inversely proportional to the spacing of the drain line or the source line and the gate electrode, the increase of the capacitance by reducing said distance in ultra-high density integrated circuits can effectively be compensated by forming the sidewall spacers on the basis of a low k material. Contrary to prior art devices containing sidewall spacers made of silicon oxide, silicon nitride or silicon oxynitride, having a dielectric constant k ranging from 3.9–6, the present invention provides field effect transistors having sidewall spacers formed of a material with a dielectric constant in the range of 3.5 to less than 1.3. Accordingly, the present invention allows a further down-scaling of the transistor devices, thereby avoiding a deteriorated device performance caused by increased gate-to-source and/or gate-to-drain capacitance and cross talk noise.

BRIEF DESCRIPTION OF THE DRAWINGS

Further advantages and objects of the present invention will become more apparent with the following detailed description when taken with reference to the accompanying drawings in which.

Figure 1A:
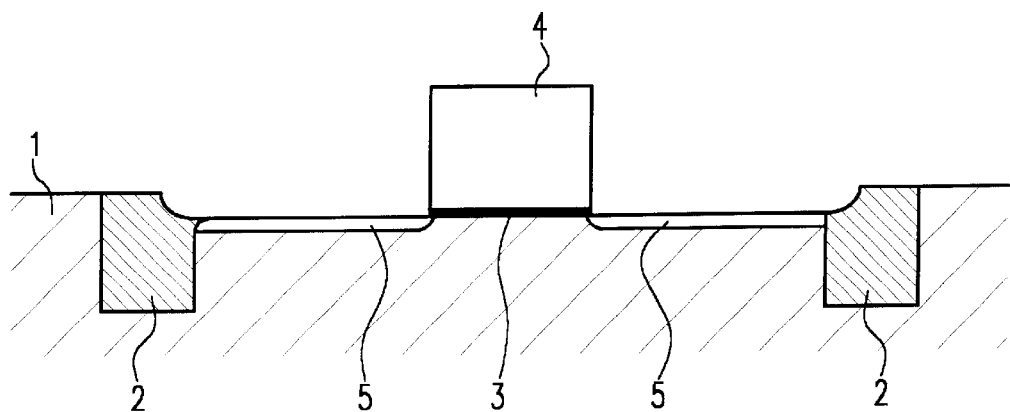
FIG. 1a schematically shows a cross-section of a field effect transistor device at a specific manufacturing stage.
Figure 1B:
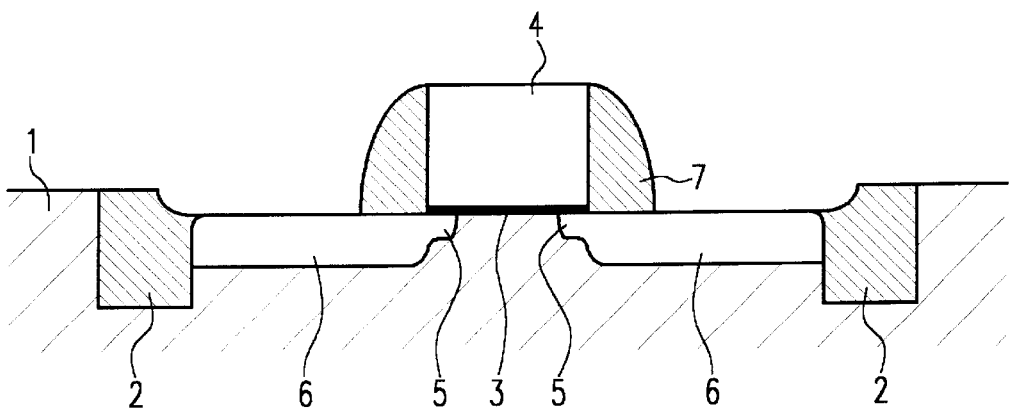
FIG. 1b schematically shows the cross-section of the field effect transistor device in an advanced manufacturing stage, depicting sidewall spacers formed according to a typical prior art process.
Figure 1C:
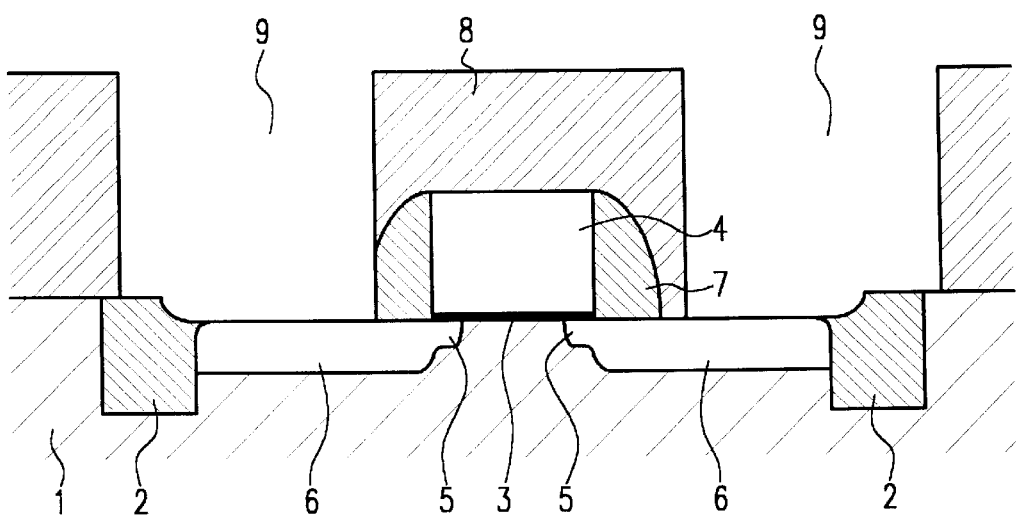
FIG. 1c schematically shows a cross-section of the field effect transistor after depositing an interlayer of dielectric material and forming openings therein.
Figure 1D:
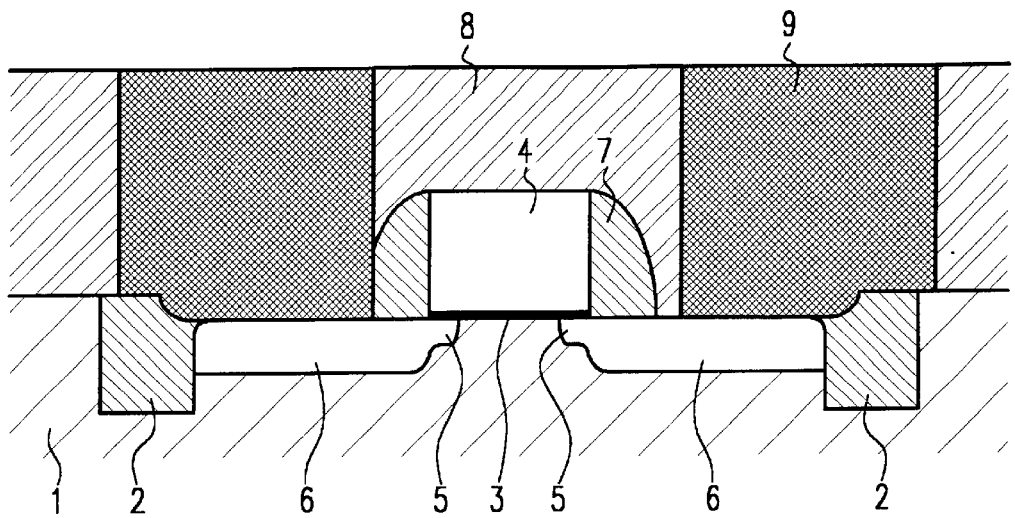
FIG. 1d schematically shows a cross-section of the field effect transistor at the manufacturing stage when drain and source lines are formed in the openings of the interlayer, illustrated in FIG. 1c.

While the present invention is described with reference to the embodiment as illustrated in the following detailed description as well as in the drawings, it should be understood that the following detailed description as well as the drawings are not intended to limit the present invention to the particular embodiment disclosed, but rather the described embodiment merely exemplifies the various aspects of the present invention, the scope of which is defined by the appended claims.

DETAILED DESCRIPTION OF THE INVENTION

Further advantages and objects of the present invention will become more apparent with the following detailed description and the appended claims. Furthermore, it is to be noted that although the present invention is described with reference to the embodiments as illustrated in the following detailed description, it should be noted that the following detailed description is not intended to limit the present invention to the particular embodiments disclosed, but rather the described embodiment merely exemplifies the various aspects of the present invention, the scope of which is defined by the appended claims.

Figure 2A:
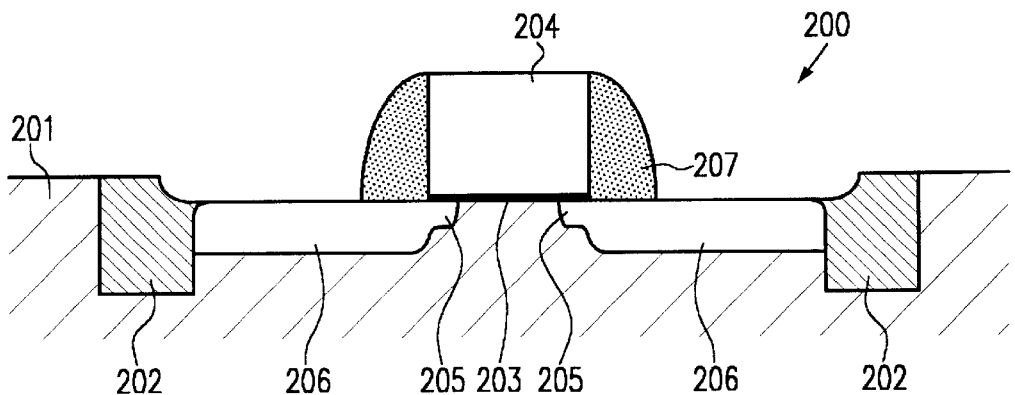
FIG. 2a shows a cross-sectional view of a field effect transistor at a specific manufacturing stage in accordance with the present invention.

FIG. 2a schematically shows a cross-section of a field effect transistor 200 at a specific manufacturing stage in accordance with the present invention. In FIG. 2a, shallow trench isolations 202 are formed in a substrate 201, which may be an appropriate semiconductor substrate, such as silicon or an insulating substrate, such as glass, and define an active region of the transistor 200. In the active region of the transistor 200, a drain and a source region 206 with corresponding lightly doped regions 205 are formed. A gate electrode 204 is located over the active region of the transistor 200 and spaced apart therefrom by a gate insulation layer 203. Sidewall spacers 207 are formed along the respective sidewalls of the gate electrode 204 and extend along the width direction of the transistor 200.

The process flow for forming the features of the field effect transistor 200 as depicted in FIG. 2a may include the following steps. After standard gate formation, as described, for example, with reference to FIGS. 1a–1d, the lightly doped regions 205 are formed by ion implantation. Thereafter, the sidewall spacers 207 are formed by depositing a material having a dielectric constant of 3.5 or less. Suitable materials for a sidewall spacer 207 include silicon oxyfluoride (F—$SiO_2$, k=2.6–3.5), hydrogen silsesquioxane (HSQ), fluorinated polyimide, parylene, polynaphtalene, polytetrafluoroethylene (P-TFE), methylsilsesquioxane (MSQ), perfluorcyclobutene, nano porous silica, and hybrid silsesquioxane. HSQ and fluorinated oxides exhibit "k" values of 3.0 and 3.5, respectively, whereas organic polymers such as polyarylene exhibit "k" values below 3.0. "K" values beyond 2.0 show nano porous silica films, porous polymers and P-TFE. These low "k" materials can be deposited by, for example, plasma enhanced CVD or high density plasma CVD. Since usually the type of deposition process affects the "k" value of the layer deposited, a variation of the low-k value of a specific material can be obtained by using a different deposition process or by changing parameter values of the deposition process, as is known from processing of previous spacer materials such as silicon oxide.

Figure 2B:
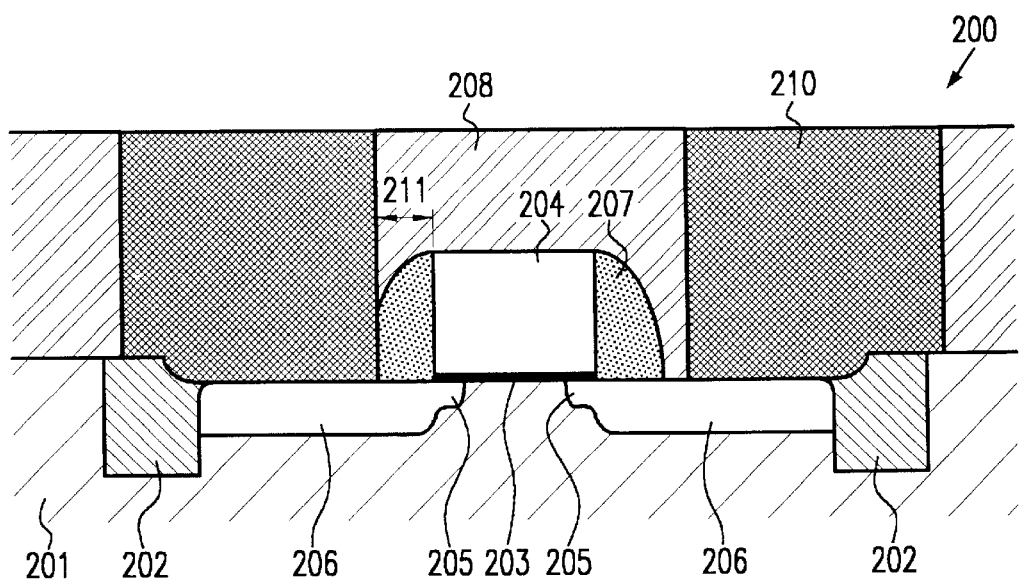
FIG. 2b schematically shows a cross-section of the field effect transistor of FIG. 2a in a further advanced manufacturing stage.

FIG. 2b schematically shows the field effect transistor 200 of FIG. 2a in an advanced manufacturing stage. Over the gate electrode 204 and the sidewall spacers 207, an insulating layer 208 is formed, adjacent to which drain and source lines 210 are located. The drain and source lines 210 may be formed as vias, lines, or both in combination, depending on design requirements. As previously noted, the drain and source lines 210 may also be referred to as local interconnects.

As previously described with reference to FIGS. 1a–1d, the insulation layer 208 formed over the structure is then planarized and openings 209 are formed which partially expose the drain and source regions 206. Thereafter, a thin barrier layer (not shown), such as a cobalt silicide or a titanium silicide layer, may be deposited so as to cover the surface of the openings 209. Next, the openings 209 are filled with a metal, such as tungsten, and the resulting structure is planarized by CMP. A distance 211, also referred to as distance "d," between the gate electrode 204 and the drain or the source line 210, depends on the precision of the alignment during the formation of the openings 209 for the drain and source lines 210. Since transistor length dimensions are steadily decreasing, the distance 211 in modern integrated circuits is typically in the range of 10–250 nm, and may even be smaller when a certain amount of misalignment occurs.

The capacitance between the gate electrode 204 and the drain and the source line 210 is proportional to k/d, where "k" is the dielectric constant of the material positioned between the source and drain line 210 and the gate electrode 204. It should be noted that for obtaining absolute values the ratio k/d has to be multiplied by the electric field constant $\epsilon_0$(8.8542×$10^{-12}$ As/Vm). Thus, a decreased distance "d" is compensated by a lower value of "k" according to the present invention, thereby allowing smaller distances "d" as in the prior art without deteriorating the performance of the transistor device. The type of material and/or the type of deposition process for the low-k material. may be selected to adjust the "k" value of the sidewall spacers 207 such that the ratio of the "k" value and the distance "d" to the source line, and the ratio of the "k" value and the distance "d" to the drain line, are both 0.35 $nm^{-1}$ or less, or about 3.099×$10^{-3}$ As/$Vm^2$ or less, when absolute values are used. This means, the present invention suggests, for example, a dielectric material with a "k" equal to 3.5 or less for a minimal distance "d" of 10 nm, or a "k" of 2.8 for a "d" of 8 nm, etc. Hence, according to the present invention, the "k" value of the sidewall spacer material may be selected such that for a minimum distance "d," depending on design rule and process accuracy, the capacitance between gate electrode and drain and source line 210 is equal to or less than a constant times 3.099×$10^{-3}$ As/$Vm^2$ for specified voltages applied to the gate, drain and source of the field effect transistor.

Furthermore, although the present invention has been described with tungsten as the metal used for the drain and source lines 210, it should be noted, however, that any appropriate material, such as copper, aluminum, etc., may be employed. Moreover, the present invention is particularly useful in transistor devices having a gate length of 0.2 μm and less, since these transistor devices generally exhibit line to gate electrode distances of 250 nm and less.

Although the present invention is described with reference to field effect transistors formed on a semiconductor substrate, such as silicon, it is to be noted that the present invention may be applied to any field effect transistor formed on any appropriate substrate. For example, the field effect transistor may be formed as an SOI (silicon on oxide) device, or may be formed on an insulating substrate or other semiconductor substrates such as III–V or II–VI semiconductors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A field effect transistor device in an integrated circuit manufactured on a substrate, comprising:

a gate electrode having opposing sidewalls extending along a width direction of the transistor, the gate electrode being formed over a substrate and separated therefrom by a gate insulation layer;

a drain line at least partially formed over a drain region, the drain line electrically connecting to the drain region; and a source line at least partially formed over a source region, the source line electrically connecting to the source region, said drain line and source line being electrically insulated and spaced apart from the gate electrode by a sidewall spacer comprised of one of the materials selected from the group consisting of hydrogen silsesquioxane, parylene, polynaphtalene, polytetrafluoroethylene, methylsilsesquioxane, perfluorcyclobutene, nano porous silica, and hybrid silsesquioxane.

2. The field effect transistor device of claim 1, wherein a length of the gate electrode is less than 0.2 μm.

3. The field effect transistor device of claim 1, wherein the drain line and the source line comprise one of tungsten, aluminum, and copper.

4. The field effect transistor of claim 1, wherein the substrate is a semiconductor substrate.

5. A field effect transistor device in an integrated circuit manufactured on a substrate, comprising:

a gate electrode having opposing sidewalls extending along a width direction of the transistor, the gate electrode being formed over a substrate and separated therefrom by a gate insulation layer;

a drain line at least partially formed over a drain region, the drain line electrically connecting to the drain region;

a source line at least partially formed over a source region, the source line electrically connecting to the source region, said drain line and source line being electrically insulated and spaced apart from the gate electrode by a dielectric sidewall spacer comprised of one of the materials selected from the group consisting of hydrogen silsesquioxane, parylene, polynaphtalene, polytetrafluoroethylene, methylsilsesquioxane, perfluorcyclobutene, nano porous silica, and hybrid silsesquioxane, wherein a ratio of a distance between the drain line and the gate electrode and a dielectric constant of the sidewall spacer times the electric field constant $\epsilon_0$, and a ratio of a distance between the source line and the gate electrode and the dielectric constant of the sidewall spacer times the electric field constant $\epsilon_0$ are equal or less than $3.099 \times 10^{-3}$ As/Vm$^2$.

6. The field effect transistor device of claim 5, wherein a length of the gate electrode is less than 0.2 μm.

7. The field effect transistor device of claim 5, wherein the drain line and the source line comprise one of tungsten, aluminum, and copper.

8. The field effect transistor of claim 5, wherein the substrate is a semiconductor substrate.

9. The field effect transistor of claim 5, wherein the substrate is an insulating substrate.

* * * * *